United States Patent
Meghpara et al.

(10) Patent No.: US 11,178,796 B2
(45) Date of Patent: Nov. 16, 2021

(54) POWER CONVERSION EQUIPMENT COOLING WITH CYCLONIC AIRBORNE PARTICLE REDUCTION

(71) Applicant: ROCKWELL AUTOMATION TECHNOLOGIES, INC., Mayfield Heights, OH (US)

(72) Inventors: Brijeshkumar Meghpara, Mequon, WI (US); Kristin N. Yee, Mequon, WI (US); David A. Figie, Mequon, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 312 days.

(21) Appl. No.: 16/142,791

(22) Filed: Sep. 26, 2018

(65) Prior Publication Data

US 2020/0100398 A1 Mar. 26, 2020

(51) Int. Cl.
*H05K 7/20* (2006.01)
*B01D 45/16* (2006.01)

(52) U.S. Cl.
CPC ......... *H05K 7/20909* (2013.01); *B01D 45/16* (2013.01); *H05K 7/20145* (2013.01)

(58) Field of Classification Search
CPC ........... H05K 7/20909; H05K 7/20145; H05K 7/20618; B01D 45/16; G06F 1/20; G06F 1/203; F24F 13/08; G02F 2201/36
USPC .............. 361/679.49–679.51, 694, 695–697; 165/80.1–80.5, 104.33, 185
See application file for complete search history.

(56) References Cited

U.S. PATENT DOCUMENTS

| | | | | |
|---|---|---|---|---|
| 5,485,350 A | * | 1/1996 | Hecht | H02B 1/56 165/80.3 |
| 6,330,154 B1 | * | 12/2001 | Fryers | H05K 7/20145 361/695 |
| 6,643,130 B1 | * | 11/2003 | DeMarchis | H05K 7/20181 165/80.3 |
| 7,817,424 B2 | * | 10/2010 | Jiang | G06F 1/20 165/104.33 |
| 8,068,338 B1 | * | 11/2011 | Tamarkin | H05K 7/20145 174/16.1 |
| 8,409,338 B2 | * | 4/2013 | Kim | B01D 46/10 96/224 |
| 2009/0244842 A1 | * | 10/2009 | Iwakiri | H05K 7/20727 361/695 |
| 2011/0075359 A1 | * | 3/2011 | Field | G10H 1/32 361/695 |

(Continued)

*Primary Examiner* — Stephen S Sul
(74) *Attorney, Agent, or Firm* — Fletcher Yoder, P.C.

(57) ABSTRACT

A cooling system is provided for power conversion circuitry. An intake section of a cooling air channeling element is arranged to direct cooling air through an enclosure, and through or around system components to circuit board-mounted circuitry to be cooled. The element has internal structures, such as deflectors that create local pockets of lower velocity and/or higher pressure air to trap airborne particles that can be evacuated through apertures (e.g., in adjacent plates or mounting structures). The intake section leads to a distribution section that is positioned adjacent to the circuit components to be cooled. The element may have an open bottom that cooperates with surrounding structures to channel the cooling air, facilitating molding of a single-piece element that can be easily mounted during system assembly.

20 Claims, 4 Drawing Sheets

(56) References Cited

U.S. PATENT DOCUMENTS

| | | | |
|---|---|---|---|
| 2012/0127664 A1* | 5/2012 | Shu | H01L 23/467 |
| | | | 361/695 |
| 2012/0155021 A1* | 6/2012 | Wei | H05K 7/20727 |
| | | | 361/690 |
| 2013/0342993 A1* | 12/2013 | Singleton | H05K 7/20836 |
| | | | 361/690 |
| 2016/0079613 A1* | 3/2016 | Gurunathan | H05K 7/20154 |
| | | | 429/439 |
| 2016/0192538 A1* | 6/2016 | Yang | H05K 7/20145 |
| | | | 361/692 |
| 2016/0360640 A1* | 12/2016 | Li | H05K 7/20954 |
| 2017/0059263 A1* | 3/2017 | Sun | H05K 7/20181 |
| 2018/0174731 A1* | 6/2018 | Fukuchi | H01L 23/36 |

\* cited by examiner

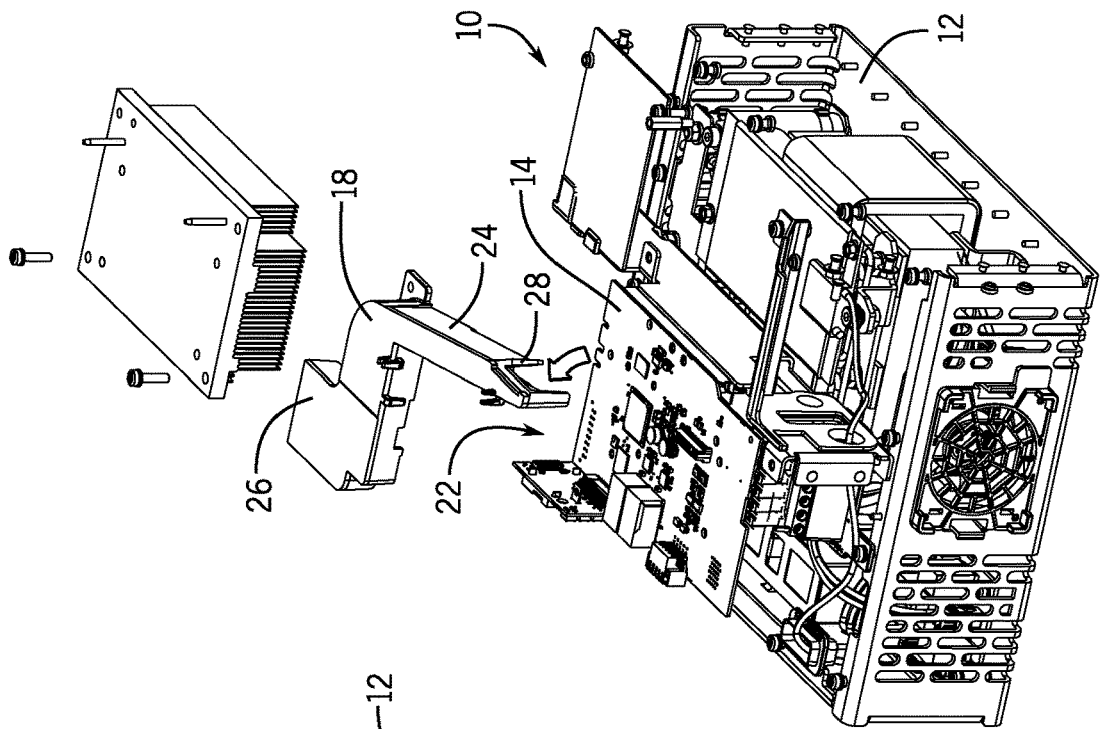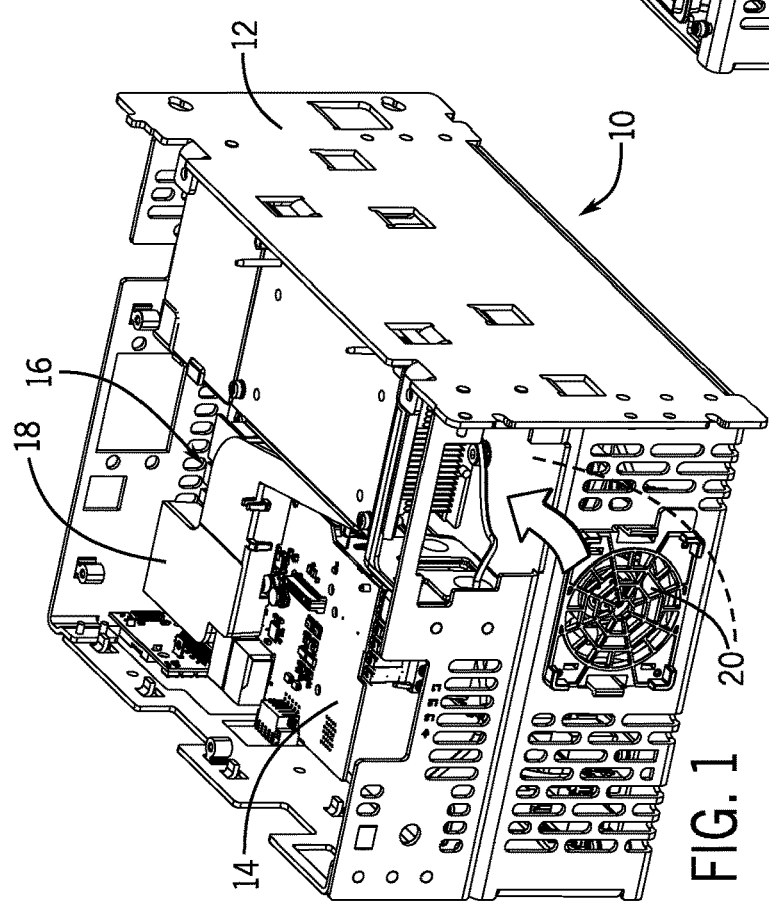

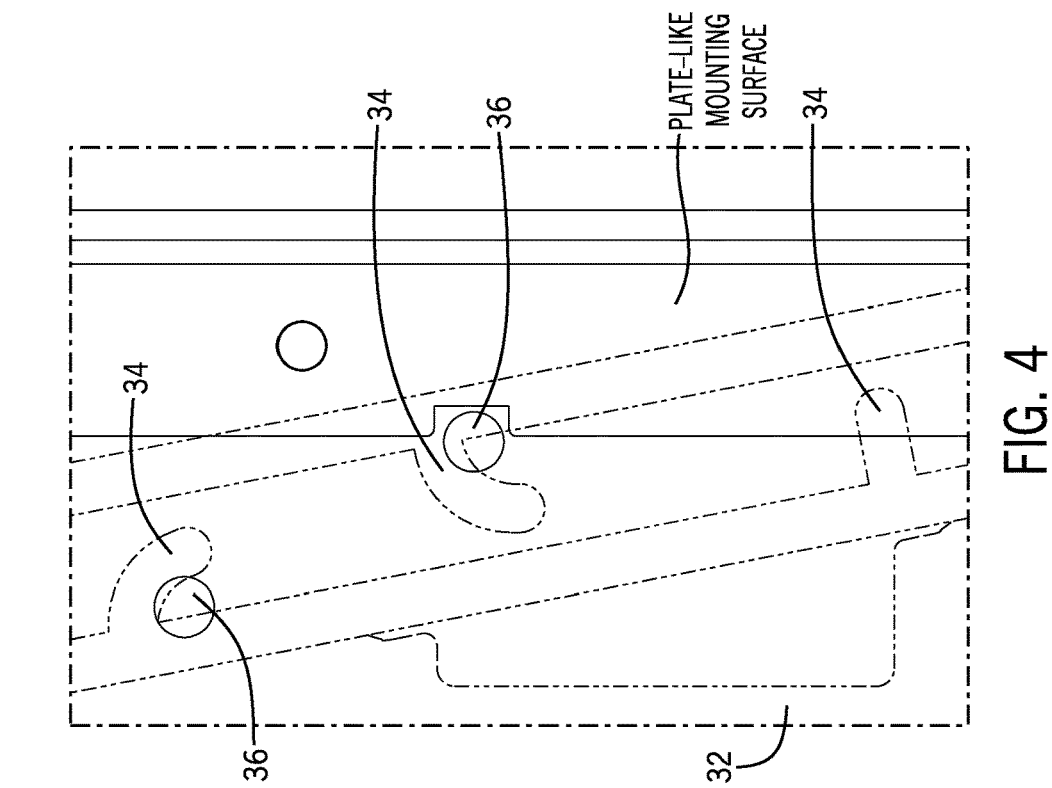
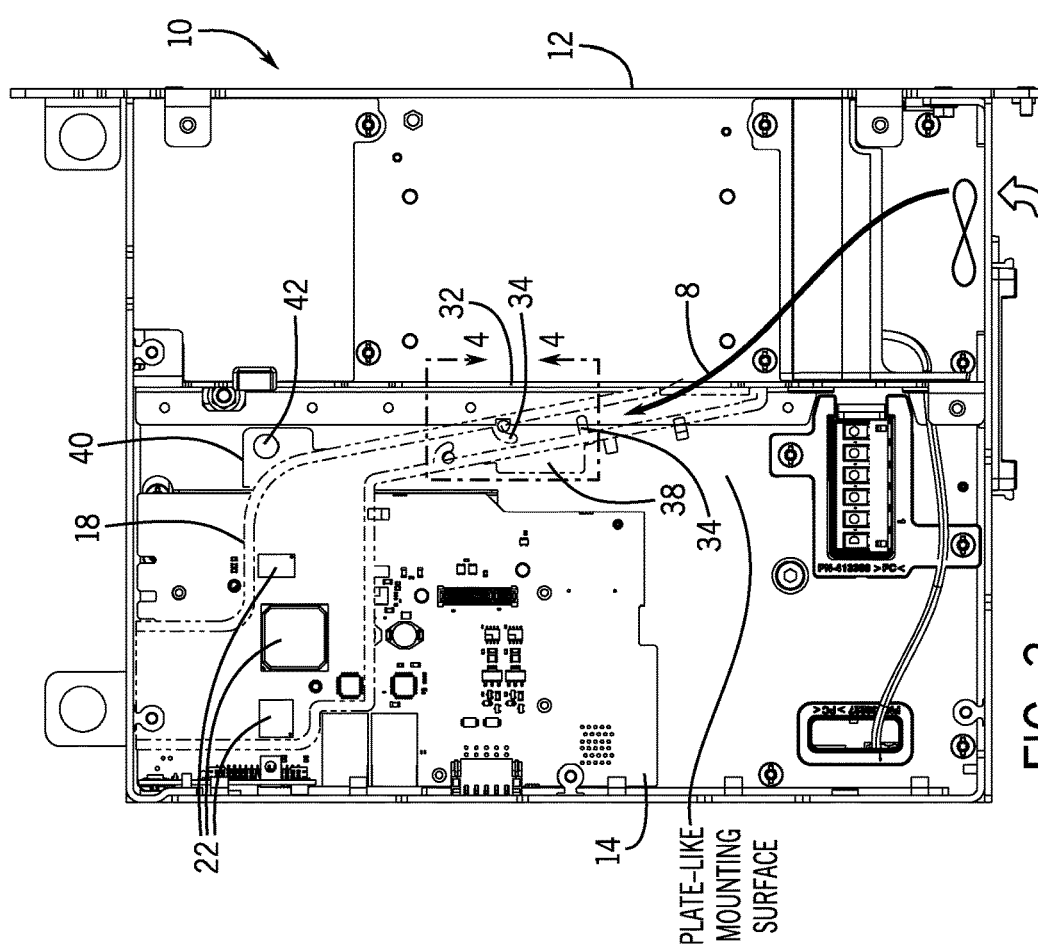

POWER CONVERSION EQUIPMENT COOLING WITH CYCLONIC AIRBORNE PARTICLE REDUCTION

BACKGROUND

The invention relates generally to techniques for cooling circuitry, such as power electronic components, and more particularly to techniques for providing cooling while avoiding contamination by airborne particles Board-mounted electronic circuits are ubiquitous throughout industry, as well as in consumer and commercial applications. Such circuits perform a vast number of different functions, and boards may be populated by a range of interconnected components linked by conductive traces. Many such devices require cooling to maintain the components in optimal working order. This is particularly true of power conversion equipment. In such applications, electrical power is converted from one useful form to another, such as from alternating current power to direct current power (e.g., by rectification circuitry), or from direct current power to alternating current power (e.g., by inverter circuitry). Many such conversions are possible, and some use power electronic switches, such as power transistors, silicon controlled rectifiers, and so forth. These devices can generate substantial heat, particularly due to switching.

Approaches to cooling such circuitry typically include heat sinks and fans, often used together. Heat sinks draw heat from the circuitry and allow for natural and/or forced convection to dump heat to the environment. Fans may force air directly over the circuits and/or specific components, as well as over or through fins of any heat sinks present.

Current technologies for cooling power conversion circuitry may suffer from drawbacks owing to the presence of particulate matter in the air streams used to cool the circuitry. For example, dust contamination and accumulation may occur when forced air cooling is used with printed circuit board components. Such contamination may cause failures if accumulation increased and cleaning is not performed, which may be difficult or impractical in certain applications owing to the continued operation and inaccessibility of the circuits.

There is a need to reduce dust contamination on electronic components, while still allowing for forced air cooling. In power conversion applications, solutions to such needs should allow for maintaining thermal performance of the product and avoiding derating limits that might otherwise be required due to the impact of contamination on cooling.

BRIEF DESCRIPTION

The present disclosure relates to a novel techniques for cooling power conversion circuits designed to respond to such needs. The techniques may be used in other environments and for other circuits, but is particularly well suited for circuits that generate significant heat, such as due to power switching. More particularly, for industrial applications the techniques may be used for such applications as servo drives, motor drives, inverter equipment, rectifiers, and so forth. The techniques allow for directing cooling air streams to specific locations where heat is to be removed, while allowing for reduction of air borne contaminates in the cooling air stream. In certain embodiments, both of these functions may be realized by a structure requiring no moving parts, and that is of straightforward manufacture and assembly with the served circuitry. Such structures may even be molded and made of one piece, and easily adapted to different assembly layouts and applications.

In accordance with one aspect of the disclosure, a circuit cooling system comprises a cooling air directing element having an intake section and a distribution section, the intake section positioned to channel an air stream to the distribution section, the distribution section positioned adjacent to power circuitry for cooling the power circuitry with the channeled air stream, the intake section having a plurality of air deflectors creating local pockets of elevated pressure in the channeled air stream, and a cooperative air directing surface having apertures adjacent to the air deflectors that, in operation, allow airborne particulate to drop from the channeled air stream.

In accordance with another aspect of the disclosure, a circuit cooling system comprises power conversion circuitry mounted on a printed circuit board in an enclosure. A cooling air directing element has an intake section and a distribution section. The intake section is positioned to channel an air stream from an intake side of the enclosure to the distribution section. The distribution section is positioned at least partially over and surrounding the power conversion circuitry for cooling the power conversion circuitry with the channeled air stream. The intake section has a plurality of air deflectors creating local pockets of elevated pressure in the channeled air stream. A cooperative air directing surface has apertures adjacent to the air deflectors that, in operation, allow airborne particulate to drop from the channeled air stream.

In accordance with a further aspect of the disclosure, a method of making a circuit cooling system comprises mounting printed circuit board power conversion circuitry in an enclosure. A cooling air directing element is mounted in the enclosure, and has an intake section and a distribution section. The intake section is positioned to channel an air stream from an intake side of the enclosure to the distribution section. The distribution section is positioned at least partially over and surrounding the power conversion circuitry for cooling the power conversion circuitry with the channeled air stream. The intake section has a plurality of air deflectors creating local pockets of elevated pressure in the channeled air stream. The cooling air directing element is secured adjacent to a cooperative air directing surface having apertures adjacent to the air deflectors that, in operation, allow airborne particulate to drop from the channeled air stream.

DRAWINGS

These and other features, aspects, and advantages of the present invention will become better understood when the following detailed description is read with reference to the accompanying drawings in which like characters represent like parts throughout the drawings, wherein:

FIG. 1 is a perspective view of a power conversion assembly employing a cooling system with cyclonic airborne particle reduction;

FIG. 2 is a partially exploded perspective view of the assembly of FIG. 1, showing an example air channeling component;

FIG. 3 is a plan view of the assembly of the previous figures with the air channeling component outlines to illustrate an example pathway for cooling air;

FIG. 4 is a detail view of a part of the air channeling component illustrating strategically placed particle drop-out openings and flow directing elements;

DETAILED DESCRIPTION

Figure 5:
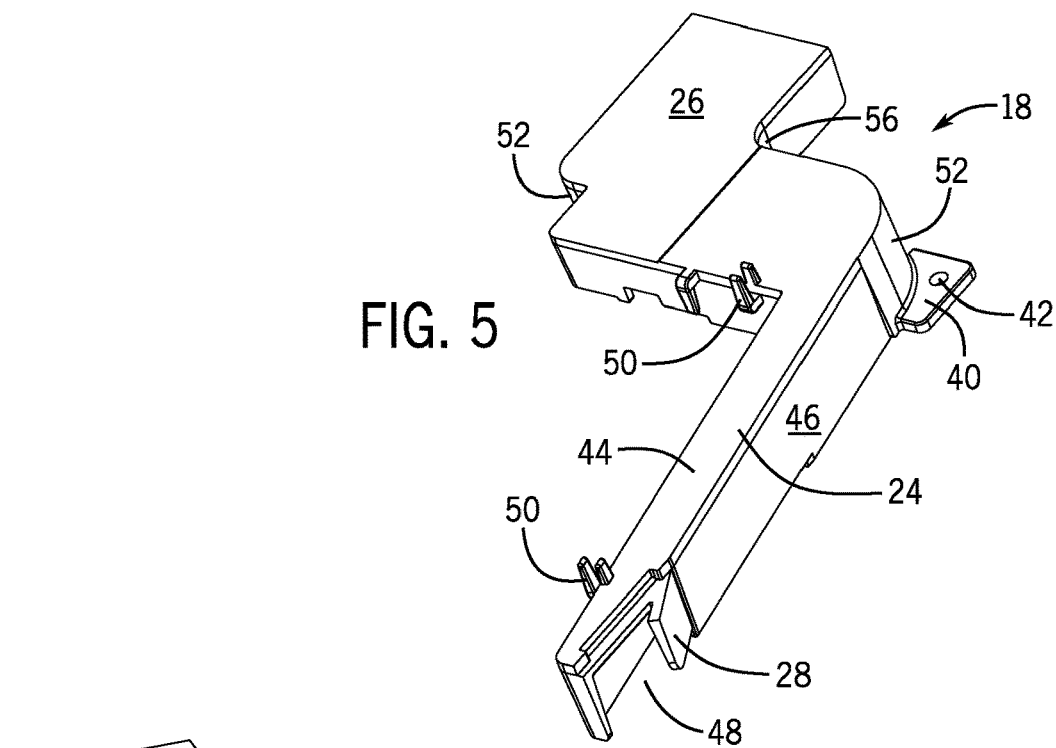
FIG. 5 is a top perspective view of an embodiment of the example air channeling component.

Turning now to the drawings, FIG. 1 a power conversion device or system is illustrated, and designated generally by the reference numeral 10. The system may comprise any number of electrical circuits for a range of operations. For example, in presently contemplated embodiments, the system is designed to power one or more actuators, such as those used in automation applications. Such actuators may include, for example, direct current (DC) or alternating current (AC) motors. The system is designed to receive incoming power, such as from a power source or grid, and to convert the power to a form used to drive the actuator. In DC applications, the outgoing power applied to the actuator may vary in its electrical parameters in order to provide for desired speeds, directions, motion profiles, and so forth. In AC applications, the outgoing power may be adapted to drive a motor at a desired speed, such as by creating a desired output frequency that is proportional to speed. The circuitry of the system may include active or passive rectifier circuits for converting AC power to DC power, AC or DC busses, inverter or conversion circuitry for converting power to desired AC output, and so forth. As discussed below, the system will comprise components, such as solid state switches, that create heat during operation, and that can be cooled by appropriately channeling cooling air via the presently disclosed techniques.

In the system illustrated in FIG. 1, an assembly enclosure 12 serves to support the various system components, and itself may be installed in a cabinet or other system support. Some of the components of the system have been removed in the figure to permit the cooling system elements to be viewed. In this embodiment, and as shown in the figure, a circuit board 14 is provided that supports electric or electronic components to be cooled, as discussed below. A cooling system 16 is illustrated, and generally includes an air channeling element 18 through which air passes to the cooled components. One or more fans 20 allow for forced air convection for cooling purposes. (Note that in the illustrated embodiment, a lower fan is illustrated, while an upper fan has been removed to allow viewing of the element 18. In practice, a similar fan may be positioned in the opening shown in the figure.)

In FIG. 2, certain of the components of the system have been exploded out to better show the circuit board 14, and particularly power conversion circuitry components 22 supported on the circuit board. As noted, these may include switches, such as power transistors (e.g., insulated-gate bipolar transistors), silicon controlled rectifiers, and so forth. Such components may be layered on a surface of the circuit board, or may be connected via pins, or in any desired manner. Other power components may also be included to channel power to and from the switches, and traces in or on the circuit board may serve as conductors for such power, as well as for control signals, feedback, and so forth. In certain embodiments, the power conversion circuitry may include one or more processors, memory, power supplies, and so forth.

In the illustrated embodiment, the air channeling element 18 has an intake section 24 and a distribution section 26. Both sections are hollow, and partially surrounded by a continuous wall, as discussed below. A diverter surface 28 is provided on an upstream side of the intake section 24 to allow a portion P of a cooling air stream S to enter into the air channeling element. In this embodiment, the diverter surface extends into an air stream P that is produced by a cooling fan, effectively causing air impinging upon the surface to be re-directed into the air channeling element. In other embodiments, a dedicated fan or other approaches may be used to ensure that sufficient air is passed through the air channeling element to provide effective cooling.

As best shown in FIGS. 2 and 3, in this embodiment, the air channeling element allows for the air stream to be channeled from an inlet side, through support structures, circuitry, and so forth, to the location of the circuitry to be cooled. Thus, as shown, one or more partitions 30 may divide the system into regions areas in which different types of circuitry or components are mounted. In this embodiment, the air channeling element is mounted on one or more panels or plates 32. The present embodiment has a generally open bottom side, and allows for channeling of cooling air by capturing the cooling air between the element 18 and the plate on which it is mounted. It should be noted that some of the channeling may also occur between the element 18 and the circuit board on which the components are mounted that are to be cooled.

The air channeling element is also configured to promote removal or drop-out of airborne particles or contaminate from the cooling air stream. As shown in FIGS. 3 and 4, for example, a plurality of deflectors 34 may be positioned in the cooling air stream on the inner side of the element 18. In this embodiment, three such deflectors are provided, and these are positioned to extend from an inner wall of the element on alternating sides. One or more of the elements may have a generally curved or concave shape with the concavity oriented towards the inlet side, that is, opposite the direction of flow of the cooling air stream. As discussed below, these deflectors cause a change in direction of the cooling air stream, leading to a local pressure (and speed and/or direction) change in the air stream that allows airborne particulate to drop from the cooling air. In the illustrated embodiment, adjacent to at least one of the deflectors, an aperture 36 allows the particulate matter to be voided or directed to a different location, avoiding channeling of such particulate to the power conversion circuitry. In this embodiment, two deflectors are associated with apertures that are formed in a mounting plate on which the element 18 is fixed.

In this embodiment, the element 18 also includes one or more flanges or other structures that allow it to be easily mounted and fixed in place during assembly of the system 10. For example, a flange 38 may contact a support surface for fixation or to provide stability of the element. Another flange 40 is illustrated as including an attachment feature (e.g., a screw hole) for securement of the element on the mounting plate. It should be noted, however, that any suitable arrangement may be used for mounting the element, including fasteners, clips, protrusions, snap structures, adhesives, and so forth. It may also be noted that in some embodiments, the element provides a lower surface that generally conforms to the mounting surface or surfaces, alleviating the need for seals, though such seals may be used in other embodiments.

Figure 6:
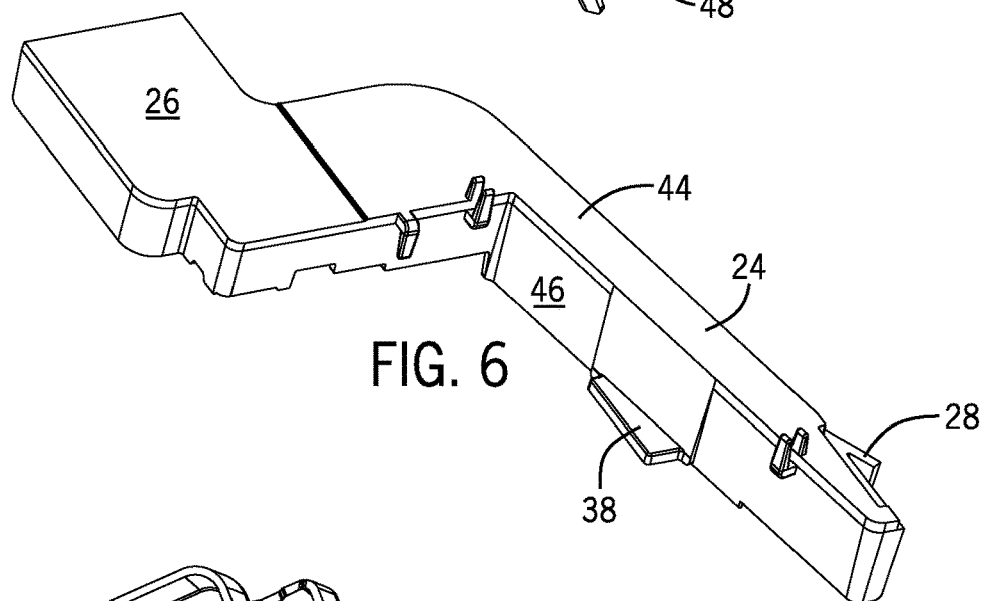
FIG. 6 is another top perspective view of the same embodiment of the example air channeling component.
Figure 7:
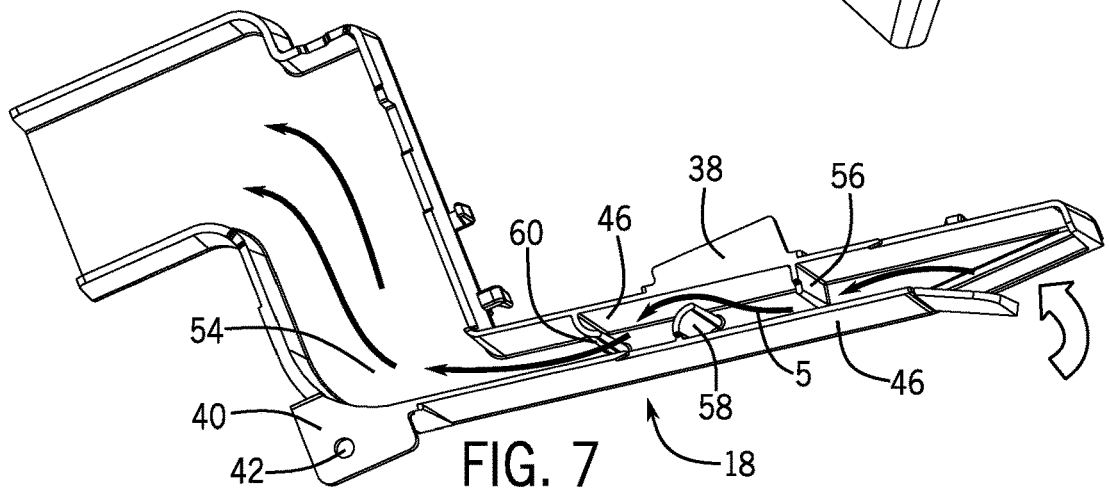
FIG. 7 is a bottom perspective view of the example air channeling component.

In the illustrated embodiment, the element 18 comprises a single piece of moldable plastic that is formed in a single operation. The manufacture is further facilitated by the use of a shell-like structure as shown in FIGS. 5, 6, and 7. This structure has an elongated top surface 44 with sides 46, and an inlet opening 48 (adjacent to the diverter surface in this embodiment). Other features may be usefully molded into (or added to) the element, such as wire clips or hangers 50 (e.g., for fan wiring). It may be noted that a wide range of physical configurations may be envisaged that still employ the channeling and particulate drop-out features described here, including different shapes, contours, and corners 52 that permit cooling air to be channeled through and along surrounding structures with minimal loss. Such contours may allow for conditioning of the air stream, control of direction, velocity, and so forth including in three dimensions. In certain currently contemplated embodiments, the molded material may include a textured inner surface that alters or perturbs the air stream to cause localized turbulence or other desirable gas dynamics.

The open bottom 54 of the element 18 is illustrated in FIG. 7. As can be seen, the top and walls, along with the internal features such as the deflectors 56, 58, and 60 can be molded into the structure in a single operation, and the resulting structure may be formed without the use of mold inserts that might otherwise complicate the manufacturing process. Of course, where desired, the element 18 could be made of two or more pieces that are fitted together to form a closed channeling structure that does not rely on part of the enclosure for air handling. Similarly, more complex arrangements could be envisioned in which a tube-like channel is defined in a single-piece or assembled structure.

In the illustrated embodiment, the open bottom effectively cups the air stream in the vicinity of the circuit components to be cooled. At this point, owing to the deflectors and the particulate drop-out apertures, a minimum of particulate material will be present, greatly reducing any accumulation of contaminate on the circuit board and components. The air may then be channeled and expelled through one or more openings, or through interstices between the board and the distribution section of the element.

Figure 8:
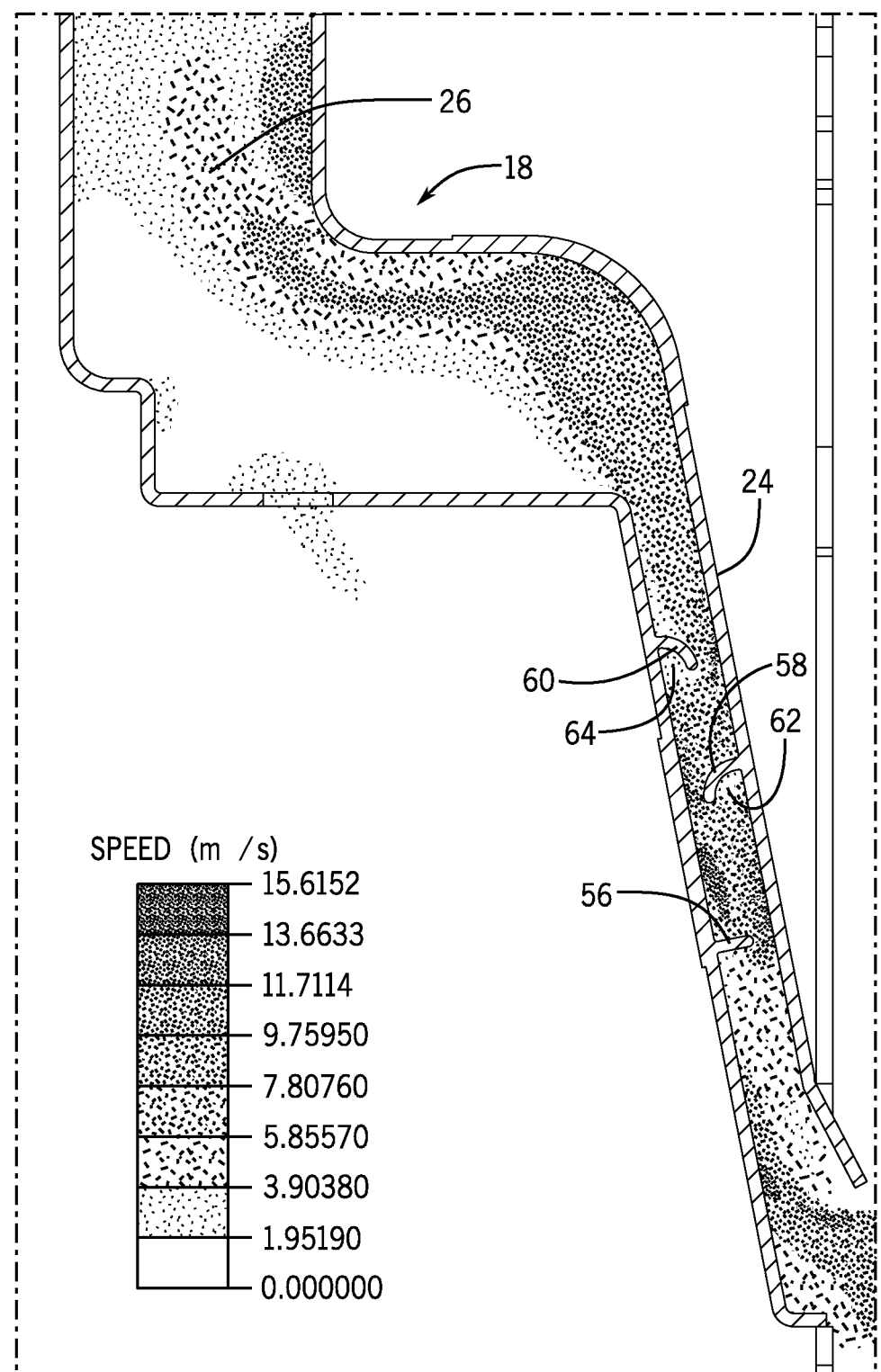
FIG. 8 is an airflow simulation image illustrating air handling via the air channeling component during use.

FIG. 8 is a diagrammatical illustration of cooling air stream flow and localized speeds of the air in an element 18 of the type described. In this embodiment, again, three deflectors 56, 58, and 60 are provided in the intake section. Each deflector causes acceleration of the air stream around its tip (resulting in consequent pressure reduction) and slowing of the air stream in a pocket formed at its base, adjacent to the inner wall of the element (resulting in consequent pressure increase). As a result, the slowed portion of the air stream causes airborne particulate to be trapped, from which point it may be evacuated through an aperture as discussed above.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A circuit cooling system comprising:
 a plate-like mounting surface;
 a cooling air directing element mounted on the plate-like mounting surface and having an intake section and a distribution section, the intake section positioned to channel an air stream to the distribution section, the distribution section positioned adjacent to power circuitry for cooling the power circuitry with the channeled air stream, the intake section having a plurality of air deflectors creating local pockets of elevated pressure in the channeled air stream; and
 the plate-like mounting surface having apertures adjacent to the air deflectors that, in operation, allow airborne particulate to drop from the channeled air stream.

2. The system of claim 1, wherein the cooling air directing element comprises a single-piece molded element.

3. The system of claim 1, wherein the cooling air directing element comprises an open side that traps the channeled air stream between the cooling air directing element and the plate-like mounting surface.

4. The system of claim 3, wherein the plate-like mounting surface comprises a circuit housing element.

5. The system of claim 1, wherein the cooling air directing element comprises an intake side diverting surface that extends into a path of forced cooling air to divert a portion of the cooling air into the intake section.

6. The system of claim 1, wherein at least a portion of the intake section comprises a textured interior surface that, in operation, perturbs flow of the cooling air stream.

7. The system of claim 1, wherein at least one of the air deflectors comprises a wall extension having a shape that is concave in a direction opposite the channeled air stream.

8. The system of claim 1, wherein at least two air deflectors extend from alternate sides of the intake section.

9. The system of claim 1, wherein at least one of the intake section and distribution section comprises a side flange facilitating mounting of the cooling air directing element to the plate-like mounting surface.

10. A circuit cooling system comprising:
 power conversion circuitry mounted on a printed circuit board in an enclosure having a plate-like mounting surface;
 a cooling air directing element mounted on the plate-like mounting surface and having an intake section and a distribution section, the intake section positioned to channel an air stream from an intake side of the enclosure to the distribution section, the distribution section positioned at least partially over and surrounding the power conversion circuitry for cooling the power conversion circuitry with the channeled air stream, the intake section having a plurality of air deflectors creating local pockets of elevated pressure in the channeled air stream; and
 the plate-like mounting surface having apertures adjacent to the air deflectors that, in operation, allow airborne particulate to drop from the channeled air stream.

11. The system of claim 10, wherein the cooling air directing element comprises an open side that traps the channeled air stream between the cooling air directing element and a portion of the enclosure.

12. The system of claim 10, wherein the plate-like mounting surface comprises at least a portion of the enclosure adjacent to the intake side.

13. The system of claim 10, comprising a fan that, in operation, forces cooling air into the enclosure, and wherein the cooling air directing element comprises an intake side diverting surface that extends into a path of forced cooling air from the fan to divert a portion of the cooling air into the intake section.

14. The system of claim 10, wherein at least one of the air deflectors comprises a wall extension having a shape that is concave in a direction opposite the channeled air stream.

15. The system of claim 10, wherein at least two air deflectors extend from alternate sides of the intake section.

16. The system of claim 10, wherein at least one of the intake section and distribution section comprises a side flange facilitating mounting of the cooling air directing element to the plate-like mounting surface.

17. A method of making a circuit cooling system comprising:
   mounting printed circuit board power conversion circuitry in an enclosure having a plate-like mounting surface;
   mounting a cooling air directing element in the enclosure on the plate-like mounting surface, the cooling air directing element having an intake section and a distribution section, the intake section positioned to channel an air stream from an intake side of the enclosure to the distribution section, the distribution section positioned at least partially over and surrounding the power conversion circuitry for cooling the power conversion circuitry with the channeled air stream, the intake section having a plurality of air deflectors creating local pockets of elevated pressure in the channeled air stream; and
   the plate-like mounting surface having apertures adjacent to the air deflectors that, in operation, allow airborne particulate to drop from the channeled air stream.

18. The method of claim 17, wherein the cooling air directing element comprises an open side that traps the channeled air stream between the cooling air directing element and a portion of the enclosure.

19. The method of claim 17, wherein at least one of the air deflectors comprises a wall extension having a shape that is concave in a direction opposite the channeled air stream, and wherein at least two air deflectors extend from alternate sides of the intake section.

20. The method of claim 17, wherein mounting the cooling air directing element in the enclosure comprises positioning an intake side diverting surface of the intake section into a path of forced cooling air from a fan mounted in the enclosure to divert a portion of the cooling air into the intake section.

* * * * *